United States Patent [19]

Hargrove

[11] Patent Number: 4,504,781
[45] Date of Patent: Mar. 12, 1985

[54] VOLTAGE WAND

[76] Inventor: Douglas L. Hargrove, 2116 Winslow Ct., Modesto, Calif. 94535

[21] Appl. No.: 430,398

[22] Filed: Sep. 30, 1982

[51] Int. Cl.³ .................................................. G01R 31/02
[52] U.S. Cl. .................................................. 324/72.5
[58] Field of Search ............. 324/72.5, 72, 65 P, 324/149; 330/264; 339/108 TP

[56] References Cited
U.S. PATENT DOCUMENTS

| | | | |
|---|---|---|---|
| 3,872,390 | 3/1975 | Nash | 330/264 |
| 4,205,264 | 5/1980 | Gold | 324/72.5 |
| 4,366,434 | 12/1982 | Ellis | 324/72.5 |

Primary Examiner—Stewart J. Levy
Assistant Examiner—Kevin D. O'Shea
Attorney, Agent, or Firm—Henry P. Sartorio

[57] ABSTRACT

In many applications for checking electrical circuits, machinery, and power sources, in the home, in the workshop or laboratory, or in the field, it is desirable to quickly determine if a voltage is present. The voltage wand comprises a high input impedance C-MOS amplifier circuit attached to a conductive probe for detecting the presence of an AC, pulsed DC or DC voltage. The C-MOS amplifier circuit is connected to a light emitting diode which lights to indicate the presence of a voltage. To detect AC or pulsed DC, the probe is brought into proximity but not contact with the voltage source and the voltage field is picked up by the probe. To detect DC, a circuit is completed through the voltage source and voltage wand.

16 Claims, 3 Drawing Figures

VOLTAGE WAND

BACKGROUND OF THE INVENTION

The invention relates generally to instruments for electrical measurement and more particularly to instruments for detecting the presence of AC, pulsed DC and DC voltages.

There are many situations, both industrial and in the home, when it is desirable to be able to detect the presence of an AC, pulsed DC or DC voltage. In the home, checking the 110 volt house voltage may be necessary in locating and repairing household appliances. The telephone ring circuit is powered by AC voltage as are 70 volt audio lines. The car ignition system is a pulsating DC system. An AC chopper may be utilized as a power source, e.g., in a battery operated forklift.

Thus there are a variety of potential users for an instrument to detect the presence of an AC, pulsed DC or DC voltage, from the homeowner to the engineer. The users would particularly include electricians, automotive mechanics working on automobile electrical systems, and air conditioning repairmen. The instrument will be useful for locating and diagnosing problems and lowering repair costs. In particular, an instrument for detecting the presence of voltages would promote safety. The instrument could be used to detect ungrounded fixtures and to indicate that high voltage lines were live.

It is desirable to have an instrument which provides a quick check of whether a voltage is present or not before more extensive measurements are undertaken. The most effective type of instrument would have the characteristics of small size and ease of use. The instrument would ideally not have to make physical contact with the conductor, since in many cases the conductor might not be readily accessible, or might be sheathed with insulation, or it would be safer not to directly contact an unknown source of potentially high voltage. The instrument should also be low cost to be available to the many potential users.

In general instruments are not available which meet all these requirements. Conventional voltmeters are available for measuring voltages, i.e., the potential between two points in a circuit. These are complicated instruments and require physical contact with the voltage source being measured. Other instruments are available to provide continuity checks in a circuit; however, these devices also require contact between different points in the circuit. Examples of these types of instruments are described in U.S. Pat. No. 3,704,411 to Jamieson issued Nov. 28, 1972 relating to a portable device for testing electrical appliances; U.S. Pat. No. 4,150,330 to Hudson et al issued Apr. 17, 1979 describing a fuse tester and flashlight; U.S. Pat. No. 3,227,948 to Cheshire issued Jan. 4, 1966 for a multipurpose flashlight structure; U.S. Pat. No. 3,753,090 to Tomek issued Aug. 14, 1973 relating to a combination flashlight and continuity tester; and U.S. Pat. No. 2,916,699 to Eisenberg et al issued Dec. 8, 1959 for a combination probe and continuity tester. Other apparatus is available which is large, bulky and complicated, is not portable, and requires an on/off switch to prevent rapid draining of batteries.

Accordingly, it is an object of the invention to provide an instrument for detecting the presence of AC, pulsed DC, or DC voltages.

It is also an object of the invention to provide an instrument which detects AC or pulsed DC voltages without any physical contact with the conductor.

It is another object of the invention to provide an instrument which is simple, small in size, portable, easy to use, and low cost.

SUMMARY OF THE INVENTION

The invention is an instrument for detecting the presence of an AC, pulsed DC, or DC voltage. The instrument has a conductive probe which is connected to the input of a C-MOS device. The output of the C-MOS device can be used to directly drive a light emitting diode (LED) or is input into a transistor whose output drives the LED. The C-MOS device and transistor are powered by batteries. In operation for an AC or pulsed DC voltage, the probe is covered with a nonconductive cap and brought into proximity with the voltage. The probe picks up the voltage field and the signal is amplified to drive the LED, turning the light on to indicate the presence of a voltage. In operation for DC, the probe must be brought into contact with the conductor and the person must touch a clip connected to the negative side of the amplifier circuit and also the opposite side of the voltage source to complete the circuit.

DETAILED DESCRIPTION OF THE PREFERRED EMBODIMENTS

The invention is an instrument for detecting the presence of AC or pulsed DC voltage without physical contact with the conductor by picking up and amplifying the AC voltage fields produced. The invention can also be used to detect the presence of a DC voltage by completing a circuit through the instrument to the conductor. The instrument detects an AC voltage or pulsed DC voltage by means of a conductive probe which picks up the voltage field surrounding the conductor and by means of an amplifier, a C-MOS integrated chip, which is sensitive to the voltage field picked up by the probe, amplifying the signal to drive an indicator means.

Figure 1:
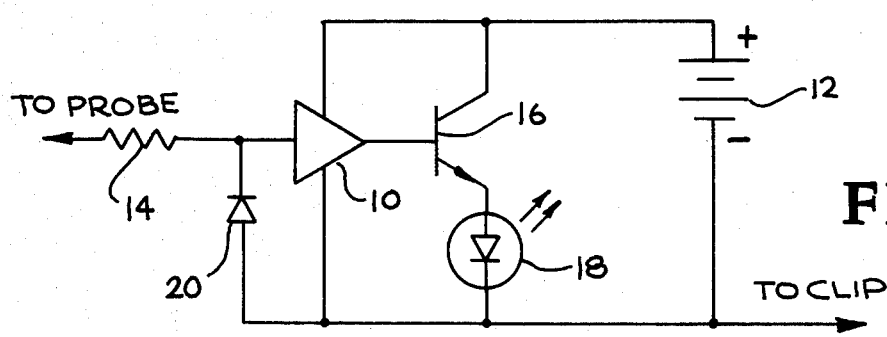
FIG. 1 is a schematic of the amplifier circuit.

The invention is illustrated schematically in FIG. 1. The main component of the invention is a very high input impedance C-MOS digital device 10 which is powered by battery means 12. The input of C-MOS device 10 is connected to the probe through high impedance limiting resistor 14. The output of C-MOS device 10 is connected to the input of a transistor 16 whose output is connected to a light emitting diode (LED) 18. The transistor 16 and LED 18 are also connected to the battery means 12. A reversed biased diode 20 is also connected across the input of the C-MOS device 10. The negative side of the circuit is also connected to an external conducting clip for operation in detecting DC voltages. The C-MOS device 10 is responsive to the AC or DC voltage picked up by the probe and produces an output to drive the transistor. Transistor 16 is a current amplifier to drive LED 18. The advantage of the C-MOS device 10 is that it is an extremely high input impedance amplifier, about $10^{12}$ ohms. Since an integrated chip is a digital device, with the characteristic of being on or off, it is superior to an analog device which uses more current. The high impedance limiting resistor 14, typically 10 megohms, is used to protect the C-MOS device 10 and for the safety of the operator when the instrument is used to detect DC voltages. The diode 20 is connected to the input of C-MOS device 10 in a reverse bias mode to function as a high impedance resistor to provide a leakage path back to the negative side of the circuit to stabilize the C-MOS device 10, i.e., to hold the digital circuit in one state (low) so LED 18 will not always be on, draining the battery means 12. The C-MOS device 10 has a low idle current so when LED 18 is off no current is drawn providing a long battery life for battery means 12 and eliminating the requirement for an on/off switch.

Figure 2:
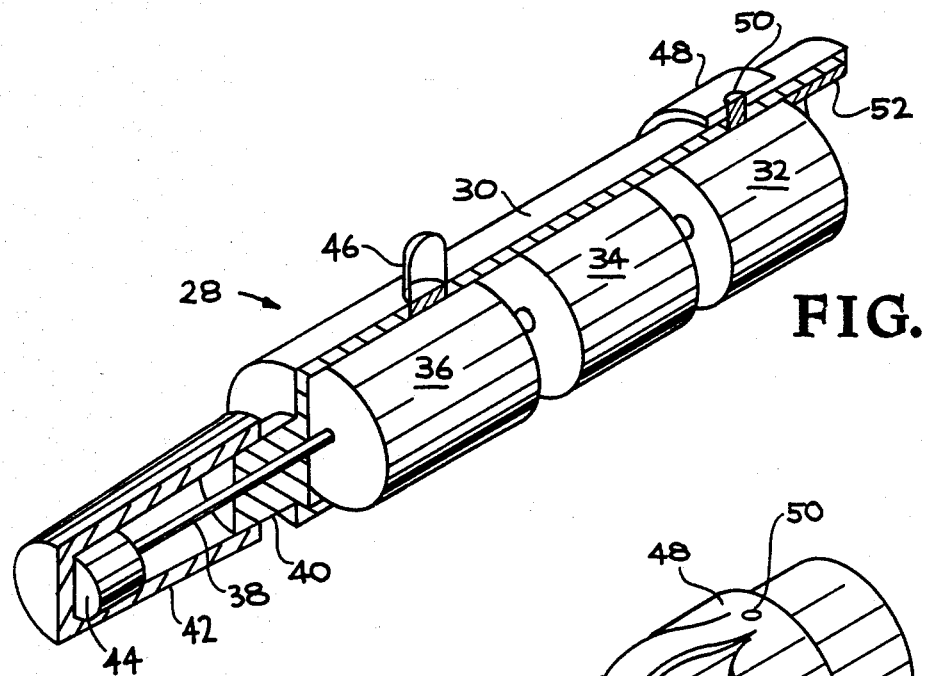
FIG. 2 is a sectional perspective view of a voltage wand.
Figure 3:
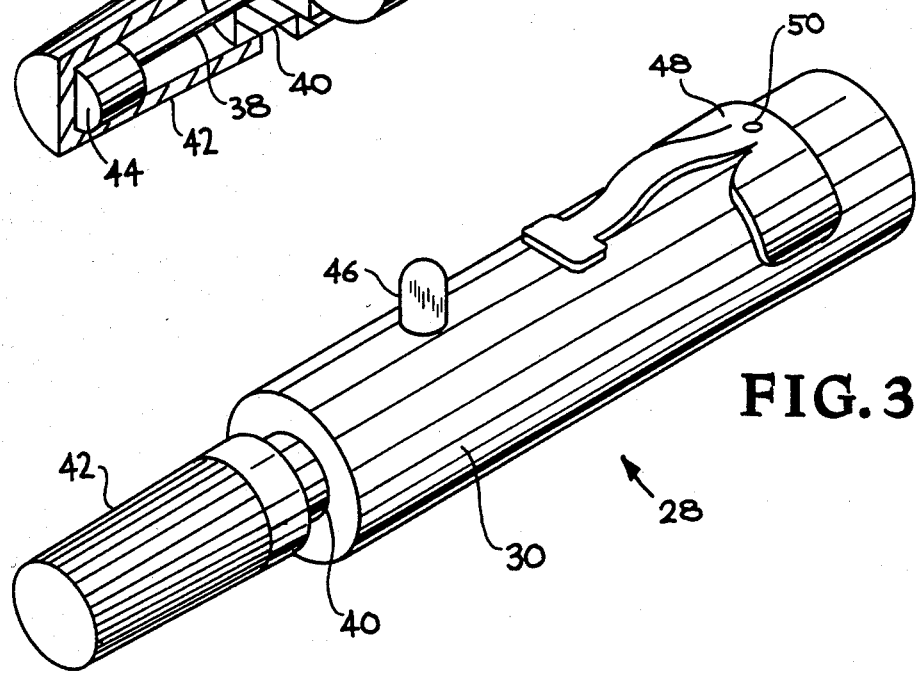
FIG. 3 is a perspective view of a voltage wand.

One embodiment of the invention is illustrated in FIGS. 2 and 3. A voltage wand 28 comprises a nonconductive, substantially cylindrical, casing 30. The casing 30 contains a pair of batteries 32 and 34 in series which are electrically connected to amplifier assembly 36. The amplifier assembly 36 is shown schematically as a package that contains the C-MOS device 10, limiting resistor 14, transistor 16 and diode 20 as shown in FIG. 1. The conducting probe 38, which is connected to the input of C-MOS device 10 through limiting resistor 14 in the amplifier assembly 36 extends through the narrow front piece 40 attached to casing 30. The probe 38 is a metal rod or wire or other conductor. A removal cap 42 of nonconductive material attaches to the front piece 40 to cover the probe 38. A piece of conductive foam 44 is held in the front of the cap 42 and makes electrical contact with the probe 38. The conductive foam 44 is mounted in the cap 42 and so is removed from the probe when the cap 42 is removed. The LED 46 is electrically connected to the amplifier assembly 36 and extends through the casing 30. A metallic clip 48 is mounted to the casing 30. A conductive contact 50 extends through the casing and electrically connects the clip 48 to the negative side of the circuit, e.g., the casing of battery 32.

The C-MOS device 10 can be selected from CD-4050, CD-4049, MC-4050, MC-4049 and CD-4107; almost any other C-MOS device can be utilized. The batteries 32 and 34 are typically two 1½ volt batteries; generally a minimum of 3 volts is required, however up to 18 volts can be utilized. Two connections of the C-MOS device 10 are connected to the batteries while the input of C-MOS device 10 is connected to the probe and the output is connected to transistor 16. The transistor 16 can be a 2N222 or PN222; however, generally any NPN transistor can be used. The LED utilized is a Sanyo 1368-10.P; however, other LEDs can be utilized. If a smaller LED or a higher output C-MOS device 10 is utilized, the transistor 16 may be eliminated altogether. Alternatively, other indicator means than a LED could be utilized.

The voltage wand 28 is assembled in the casing 30, such as a pen casing or other casing of nonconductive material. This provides a convenient physical size so that the voltage wand can be carried in the pocket of the operator. The elements can be permanently potted into the casing 30 or removably inserted through an end cap 52, which would permit replacement of the batteries 32 and 34. However, since the device places little drain on the batteries, the batteries will have a long lifetime and the voltage wand can be essentially a throw-away device.

In operation, when checking for an AC or pulsed DC voltage the cap 42 is kept on the casing 30, bringing the conducting foam 44 into contact with the probe 38. The tip 42 is placed near the voltage to be detected. The conductive foam 44 provides a larger surface area for the probe 38 to pick up the AC voltage, making the orientation of the probe less critical. The voltage signal is picked up by the probe, amplified by the circuit, turning the LED on to show the presence of a voltage.

To detect a DC voltage the cap 42 is removed, thereby also removing the conductive foam 44 from the probe 38. The probe 38 is placed into contact with the conductor. The operator must hold the clip 48 and also touch the negative side of the voltage source to complete the circuit. The 10 megohm limiting resistor prevents the operator from being exposed to a high current. Alternatively, the clip can be connected to the voltage source by means of a jumper wire, eliminating the need for the operator to use his body to complete the circuit. With the probe making contact with the conductor the return path is through the clip, through the operator, to the negative side of the DC source. DC voltages as low as 3 volts can be detected.

For safety reasons and for practical purposes, for the types of circuits and sources that are likely to be checked with this instrument, the normal range for detecting AC voltages is 70 to 500 volts, and for DC voltages it is 3 to 48 volts. However, the instrument can function outside these ranges, which are only suggested practical limits for the operation. A low AC voltage may be detected in the DC mode of operation.

The instrument has an additional self-check feature. By rubbing the tip 42 on the operator's sleeve static electricity will be produced which will cause the LED to light up, showing that the instrument is operating.

The circuits as described is designed to detect the presence of positive voltages. However, by a simple change, connecting the LED 18 between the amplifier output and the positive side of the battery and the diode 20 between the input and positive side of the battery, the instrument can be configured to detect negative voltages.

Changes and modifications in the specifically described embodiments can be carried out without departing from the scope of the invention which is intended to be limited only by the scope of the appended claims.

I claim:

1. Apparatus for detecting the presence of an AC, pulsed DC or DC voltage, comprising:
   a high input impedance C-MOS digital device;
   power supply means connected to the C-MOS device;
   a nonconductive casing, the C-MOS device and power supply means being contained within the casing;
   a conductive probe electrically connected to the input of the C-MOS device and extending from the casing;
   a nonconductive cap removably mounted to the casing to cover the probe extending from the casing;
   a piece of conductive foam mounted in the removable cap which is held in electrical contact with the probe when the cap is mounted to the casing; and
   indicator means connected to the output of the C-MOS device and extending from the casing.

2. The apparatus of claim 1, further including a transistor connected between the C-MOS device and the indicator means, the output of the C-MOS being input to the transistor, the output of the transistor being connected to the indicator means.

3. The apparatus of claim 1, wherein the indicator means is a light emitting diode.

4. The apparatus of claim 2, wherein the indicator means is a light emitting diode.

5. The apparatus of claim 2, further including a reverse biased diode connected across the input of the C-MOS device to stabilize the C-MOS in one state.

6. The apparatus of claim 5, further including a high impedance limiting resistor connected between the probe and the input of the C-MOS device.

7. The apparatus of claim 1, wherein the probe is a conductive rod.

8. The apparatus of claim 1, wherein the power supply means is a battery.

9. The apparatus of claim 1, further including a conductive clip mounted to the exterior of the casing and electrically connected to the negative side of the power supply means.

10. The apparatus of claim 1 wherein the C-MOS digital device has an input impedance of about $10^{12}$ ohms.

11. The apparatus of claim 1 further including a reverse biased diode connected across the input of the C-MOS device to stabilize the C-MOS device in one state.

12. The apparatus of claim 1 further including a high impedance resistor connected across the input of the C-MOS device to stabilize the C-MOS device in one state.

13. A voltage wand for detecting the presence of AC, pulsed DC or DC voltages, comprising:

a substantially cylindrical nonconductive casing;

a high impedance C-MOS device mounted in the casing;

battery means mounted in the casing, and electrically connected to the C-MOS device to power the C-MOS device;

indicator means electrically connected to the output of the C-MOS device, and projecting from the casing;

a high impedance limiting resistor mounted in the casing and connected to the input of the C-MOS device;

a conductive probe projecting from one end of the casing and electrically connected through the limiting resistor to the input of the C-MOS device;

a reverse biased diode mounted in the casing and electrically connected across the input of the C-MOS device;

a nonconductive cap detachably mounted to the end of the casing to cover the probe;

a piece of conductive foam mounted in the cap which is held in electrical contact with the probe when the cap is mounted to the casing; and a conductive clip mounted to the exterior of the casing and electrically connected to the negative side of the battery means.

14. The voltage wand of claim 13, further including a transistor having its input connected to the output of the C-MOS device and its output connected to the indicator means, the transistor also being electrically connected to the battery means.

15. The voltage wand of claim 13, wherein the indicator means is a light emitting diode.

16. The voltage wand of claim 14, wherein the indicator means is a light emitting diode.

* * * * *